(12) United States Patent
Kimura

(10) Patent No.: US 6,973,239 B2
(45) Date of Patent: Dec. 6, 2005

(54) OPTICAL SEMICONDUCTOR MODULE EQUIPPED WITH A LIGHT MONITOR FOR MONITORING SIGNAL LIGHT EMITTED FROM A LIGHT EMITTING ELEMENT

(75) Inventor: Naoki Kimura, Tokyo (JP)

(73) Assignee: NEC Corporation, Tokyo (JP)

( * ) Notice: Subject to any disclaimer, the term of this patent is extended or adjusted under 35 U.S.C. 154(b) by 71 days.

(21) Appl. No.: 10/067,337

(22) Filed: Feb. 7, 2002

(65) Prior Publication Data

US 2002/0110334 A1    Aug. 15, 2002

(30) Foreign Application Priority Data

Feb. 14, 2001    (JP) .............................. 2001-036324

(51) Int. Cl.$^7$ ................................ G02B 6/30
(52) U.S. Cl. .......................... 385/49; 385/48
(58) Field of Search .......................... 385/49, 31, 28, 385/48, 129

(56) References Cited

U.S. PATENT DOCUMENTS

| | | | |
|---|---|---|---|
| 4,165,496 A * | 8/1979 | Di Domenico et al. ....... | 372/31 |
| 4,776,661 A | 10/1988 | Handa | |
| 4,815,081 A | 3/1989 | Mahlein et al. | |
| 6,081,638 A * | 6/2000 | Zhou ........................... | 385/31 |
| 2001/0033716 A1 * | 10/2001 | Fukutomi ................... | 385/49 |

FOREIGN PATENT DOCUMENTS

| | | |
|---|---|---|
| EP | 0 319 230 A | 6/1989 |
| GB | 2 197 122 A | 5/1988 |
| JP | 53-65090 | 6/1978 |
| JP | 61-123190 A | 6/1986 |
| JP | 61-123190 A | 7/1986 |
| JP | 2-42782 A | 2/1990 |
| JP | 3-504288 A | 9/1991 |
| JP | 11-38279 | 2/1999 |
| JP | 11-68705 A | 3/1999 |
| JP | 11-133255 A | 5/1999 |
| JP | 2000-208858 A | 7/2000 |
| JP | 2001-177181 A | 6/2001 |
| JP | 2001-185753 A | 7/2001 |
| JP | 2002-50826 A | 2/2002 |
| JP | 2002-223027 A | 8/2002 |

* cited by examiner

*Primary Examiner*—Sung Pak
(74) *Attorney, Agent, or Firm*—Sughrue Mion, PLLC

(57) ABSTRACT

Transmission signal light emitted from a light emitting element is coupled to an optical waveguide and guided into a transmission line. A light monitor a portion of leakage light, which is used for control of optical output of the light emitting element. The optical semiconductor module is covered with transparent resin that is closely matched to the refractive index of a clad layer covering the optical waveguide. The light leaked to the inside of the clad layer is not reflected at a top surface of the clad layer and is received at a light receiving surface of the light monitor.

12 Claims, 4 Drawing Sheets

OPTICAL SEMICONDUCTOR MODULE EQUIPPED WITH A LIGHT MONITOR FOR MONITORING SIGNAL LIGHT EMITTED FROM A LIGHT EMITTING ELEMENT

BACKGROUND OF THE INVENTION

1. Field of the Invention

The present invention relates to an optical semiconductor module in an optical communication network, and more particularly, to an optical semiconductor module equipped with a light monitor that monitors light emitted from a light emitting element on an optical waveguide.

2. Description of the Related Art

In a related optical semiconductor module, a light monitoring element is used to control the output level emitted from a light emitting element, such as a semiconductor laser. The light monitor element receives a portion of the light emitted from the light emitting element and monitors that portion of light. In order to perform this monitoring function, the light monitor element is disposed at a rear portion of the semiconductor laser. In this arrangement, the light monitor element receives light emitted from the rear of the semiconductor laser and detects its optical output level in order to perform optical output control through feedback control thereof.

Optical semiconductor modules for two-way optical communication, equipped with both a light emitting element for emitting signal light for transmission and a light receiving element for receiving transmitted signal light, are presently in use. Japanese Laid-open Patent Application Heisei 11-38279 discloses the optical semiconductor module for two-way optical communication as shown in FIG. 1. In FIG. 1, the optical semiconductor module 1 is constructed of an optical waveguide substrate 2, a light emitting element 3, a light monitor 4 and a light receiving element 5. The light emitting element 3 is provided on the optical waveguide substrate 2 and is optically coupled to a first optical waveguide 6. The light receiving element 5 is provided on the optical waveguide substrate 2 and is coupled to a second optical waveguide 7. The optical semiconductor module 1 is constructed such that, by arranging the light emitting element 3 and the light receiving element 5 in parallel, back light emitted from the light emitting element 3 is not incident on the light receiving element 5.

In this optical semiconductor module, because the light monitor 4 directly receives the back light emitted from the light emitting element 3, the light monitor 4 must be a waveguide incident type. However, a light monitor 4 of the waveguide incident type is more expensive than that of a front surface incident type, which is generally used at present. Thus, there are drawbacks, e.g., it is difficult to produce the module at lower cost and extremely precise installment is required due to the small size of the light receiving portion of the light monitor 4.

In addition, because the back light emitted by the light emitting element 3 is used as monitor light, any increase the reflectance of the back surface of the light emitting element 3 in order to increase the light output from the light emitting element 3 is not permitted.

SUMMARY OF THE INVENTION

Accordingly, an aspect of the present invention provides the optical semiconductor module at lower cost by making the installment of the light monitoring element easier.

Also, another aspect of the present invention improves the optical output of the light from the light emitting element by increasing the reflectance of the back surface of the light emitting element. This provides an optical semiconductor module capable of monitoring functions while improving its temperature properties.

The present invention provides an optical semiconductor module comprising a light emitting means that emits signal light, an optical transmitting means that transmits the signal light, a light monitoring means that receives forward light emitted from the light emitting means, and a support means that supports the light emitting means and the optical transmitting means. It is preferable that the light monitoring means is arranged above the optical transmitting means such that a light receiving surface faces downward with respect to the support means. The forward light is a portion of the leakage light that is not coupled to the optical transmitting means. Preferably, the optical transmitting means is an optical waveguide. An optical semiconductor module of the present invention further comprises a reflecting means disposed between the optical waveguide and the support means for reflecting leakage light of the signal light that is not coupled to the optical waveguide. Preferably, the light monitoring means receives not only receiving forward light emitted from the light emitting means but also leakage light reflected by the reflecting means. The optical transmitting means may be an optical fiber. The optical transmitting means also comprises positioning means that positions the optical fiber so that the signal light emitted from the light emitting means can be optically coupled to the optical fiber. The light monitoring means is provided so that it cannot contact the optical fiber.

Another optical semiconductor module of the present invention comprises a light emitting means that emits signal light, a first guiding means that guides the signal light, a light monitoring means that receives forward light emitted from the light emitting means, and a second guiding means that guides the signal light input to the optical semiconductor module. The optical semiconductor module further comprises a coupling means that couples the light guided through the first guiding means and the light guided through the second guiding means, and a support means that supports the light emitting means. The optical semiconductor module further comprises a light receiving means that receives the signal light guided by the second guiding means. The light receiving means is provided on the support means and the light monitoring means is arranged above the first guiding means such that a light receiving surface faces downward with respect to the support means. The forward light is a part of the leakage light that is not coupled to the first guiding means. The first guiding means is a first waveguide and the second guiding means is a second waveguide.

Another optical semiconductor module of the present invention comprises a light emitting means that emits a first signal light, a first guiding means that guides the first signal light and a light monitoring means that receives the forward light emitted from the light emitting means. The optical semiconductor module further comprises a second guiding means that guides a second signal light input into the optical semiconductor module, a filtering means that allows transmission of a predetermined wavelength of signal light and a support means that supports the light emitting means. The optical semiconductor module also comprises a third guiding means that guides the signal light allowed transmission by the filtering means and the light receiving means that receives the signal light guided through the third guiding means. The light receiving means is provided on the support means. The filtering means reflects the first signal light and allows transmission of the second signal light. The first guiding means is a first waveguide, the second guiding means is a second waveguide and the third guiding means is a third waveguide. The light monitoring means is arranged above the first guiding means such that a light receiving surface faces downward with respect to the support means. The forward light is a part of the leakage light that is not coupled to the first guiding means.

Another optical semiconductor module of the present invention comprises a light emitting element that emits signal light, an optical waveguide that transmits the signal light, a light monitor that receives forward light emitted from the light emitting element, and a substrate for supporting the light emitting element and the optical waveguide. The light monitor is arranged above the optical waveguide such that a light receiving surface faces downward with respect to the substrate. The forward light is a part of the leakage light that is not coupled to the optical waveguide. The optical semiconductor module also comprises a reflection film disposed between the optical waveguide and the substrate for reflecting leakage light of the signal light that is not coupled to the optical waveguide. The light monitor receives not only receiving forward light emitted from the light emitting element but also leakage light reflected by the reflection film.

Another optical semiconductor module of the present invention comprises a light emitting element that emits a signal light, an optical fiber that transmits the signal light, a light monitor that receives forward light emitted from the light emitting element, and a substrate for supporting the light emitting element and the optical fiber. The light monitor is arranged above the optical fiber such that a light receiving surface faces downward with respect to the substrate. The forward light is a portion of the leakage light that is not coupled to the optical fiber. The optical semiconductor module further comprises positioning grooves for positioning the optical fiber so that the signal light emitted from the light emitting element can be optically coupled to the optical fiber. The light monitor is provided so that it cannot contact the optical fiber.

Another optical semiconductor module of the present invention comprises a light emitting element that emits signal light, a first waveguide that guides the signal light and a light monitor that receives forward light emitted from the light emitting element. The optical semiconductor module further comprises a second waveguide that guides signal light input to the optical semiconductor module, a branch waveguide that couples light guided through the first waveguide and light guided through the second waveguide and a substrate for supporting the light emitting element. The optical semiconductor module also comprises a light receiving element that receives signal light guided by the second waveguide. The light receiving element is provided on the substrate and the light monitor is arranged above the first waveguide such that a light receiving surface faces downward with respect to the substrate. The forward light is a part of the leakage light that is not coupled to the first waveguide.

Another optical semiconductor module of the present invention comprises a light emitting element that emits a first signal light, a first waveguide that guides the first signal light and a light monitor that receives a forward light emitted from the light emitting element. The optical semiconductor module further comprises a second waveguide that guides a second signal light input into the optical semiconductor module, a filter that allows transmission of a predetermined wavelength of signal light and a substrate for supporting the light emitting element. The optical semiconductor module also comprises a third waveguide that guides signal light allowed transmission by the filter, and a light receiving element that receives signal light guided through the third waveguide. The light receiving element is provided on the substrate. The filter reflects the first signal light and allows transmission of the second signal light. The light monitor is arranged above the first waveguide such that a light receiving surface faces downward with respect to the substrate. The forward light is a part of the leakage light that is not coupled to the first waveguide.

According to the present invention, it is possible to make the installment of the light monitor easy and to produce the optical semiconductor module at a lower cost.

BRIEF DESCRIPTION OF THE DRAWINGS

These and other aspects, features and advantages of the present invention will become more fully apparent from the following detailed description taken in conjunction with accompanying drawings. In the drawings.

DETAILED DESCRIPTION OF THE INVENTION

Hereinafter, each exemplary embodiment of the present invention will be described in detail with reference to the drawings.

Figure 1:
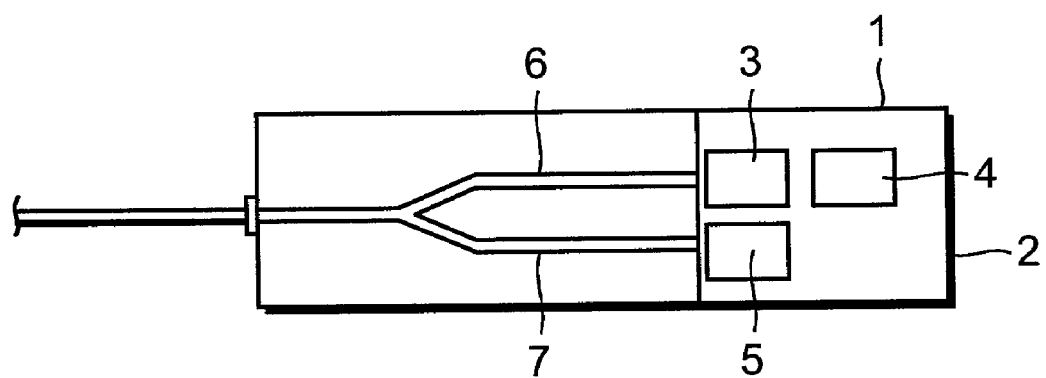
FIG. 1 is a diagram showing a related optical semiconductor module.
Figure 2A:
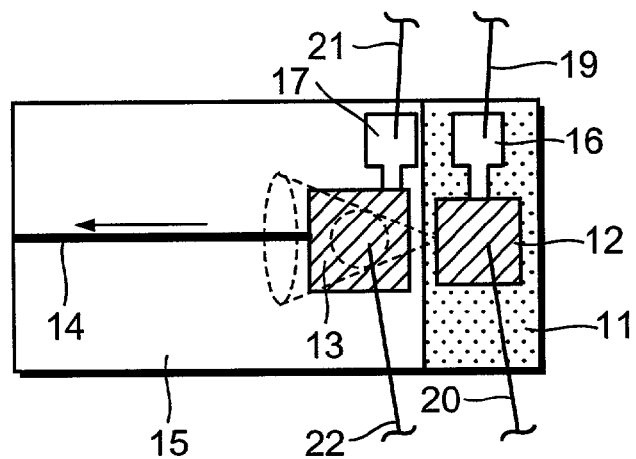
FIG. 2A is a front diagram showing a first exemplary embodiment of an optical semiconductor module according to the present invention.
Figure 2B:
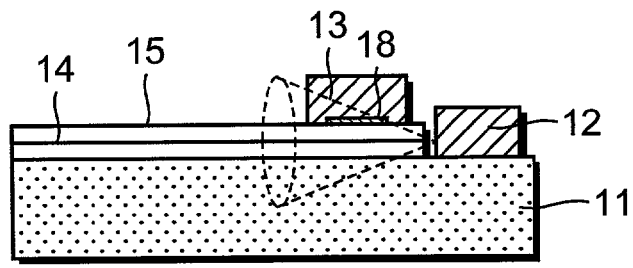
FIG. 2B is a side view of the optical semiconductor module of FIG. 2A.

Referring to FIG. 2A, a front diagram showing a first exemplary embodiment of an optical semiconductor module according to the present invention is shown. FIG. 2B is a side view of the optical semiconductor module of FIG. 2A. In FIGS. 2A and 2B, the optical semiconductor module of the present invention is constructed of an optical waveguide substrate 11, a light emitting element 12 and a light monitor 13. On the optical waveguide substrate 11, an optical waveguide 14, a clad layer 15, an electrode 16 that is coupled to the light emitting element 12 and an electrode 17 that is coupled to the light monitor 13 are provided.

Transmission signal light emitted from the light emitting element 12 is coupled to the optical waveguide 14 and guided into a transmission line. The light monitor 13 is provided on the clad layer 15. The light monitor 13 receives, among the light emitted from the light emitting element 12, a portion of the leakage light that is not coupled to the optical waveguide 14, and controls the optical output of the light emitting element 12. In FIGS. 2A and 2B, the dotted lines represent a substantially cone-shaped beam of light that is emitted from the light emitting element 12. Because the entire optical semiconductor system is covered with a transparent resin having a closely matched refractive index, light leaked inside the clad layer 15 is not reflected at the top surface of the clad layer 15 and is received at a light receiving surface 18 of the light monitor 13. The light emitting element 12 is installed such that light emitted from the light emitting element 12 can be coupled to the optical waveguide 14. To drive the light emitting element 12, wires 19 and 20 are connected to the top surfaces of the electrode 16 and the light emitting element 12, respectively. Preferably, the optical waveguide 14 and the clad layer 15 are formed of quartz glass. However, the optical waveguide 14 and the clad layer 15 could also be constructed from organic materials, such as polymers, silicon or other semiconductors.

The light monitor 13 is installed such that the light receiving surface 18 of the light monitor 13 faces downward on the clad layer 15 so as to receive part of the leakage light that is not coupled to the optical waveguide 14. The light monitor 13 is a front surface incident type. However, it is also possible to employ a back surface incident type as the light monitor 13 as well. In order to prevent the light leaked to the inside of the clad layer 15 from being reflected at the top surface of the clad layer 15, the entire optical semiconductor module is covered with a transparent resin having a closely matched refractive index. Wires 21 and 22 are connected to the top surfaces of the electrode 7 and the light monitor 3, respectively, and current produced by the light monitor 13 when receiving light emitted from the light emitting element 12 is output through wires 21 and 22.

Since the light emitting element 12 does not use the back light as the monitor light, the reflectance of the back surface of the light emitting element 12 can be increased. As the result, it is possible to improve the optical output of the front light, as well as the temperature properties, of the light emitting element 12. Also, because a space for installing the light monitor 13 is not required at the rear of the light emitting element 12, miniaturization of the optical waveguide substrate 11 becomes possible. Moreover, the light monitor 13 has a large light receiving surface as compared with that of the light receiving element of a waveguide incident type. Therefore, it is possible to relax the precision of the installment of the light receiving element.

Figure 3:
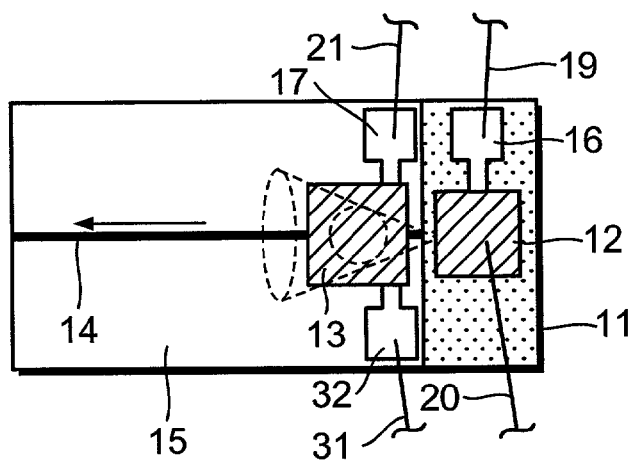
FIG. 3 is a diagram showing a second exemplary embodiment of an optical semiconductor module according to the present invention.

Referring to FIG. 3, a second exemplary embodiment of the present invention is shown. In the second exemplary embodiment, instead the light receiving current of a light monitor 13 passing through electrodes provided on a front surface and a back surface of the light monitor 13, the light monitor 13 is provided with two electrodes coupled to the light receiving surface 18. As to the same elements shown in FIGS. 2A and 2B, the same reference numbers are used.

The light monitor 13 is installed such that the light receiving surface 18 of the light monitor 13 faces downward so as to receive a portion of the leakage light that is not coupled to the optical waveguide 14. The light monitor 13, the electrode 17 and an electrode 32 provided on the clad layer 15 are connected simultaneously at the time of installing the light monitor 13. In order receive the light receiving current of the light monitor 13, wires 21 and 31 are connected to the electrode 17 and the electrode 32, respectively.

Figure 4:
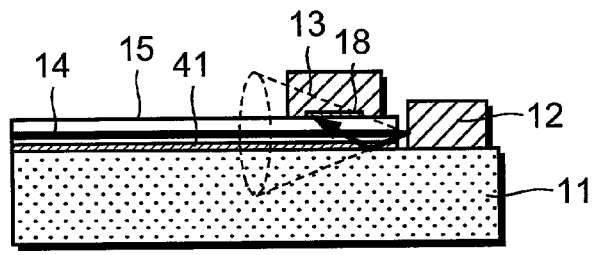
FIG. 4 is a diagram showing a third exemplary embodiment of an optical semiconductor module according to the present invention.

Referring to FIG. 4, a third exemplary embodiment of the present invention is shown. As to the same elements as shown in FIGS. 2A and 2B, the same reference numbers are used. The third embodiment provides a metal layer 41 as a reflection film for reflecting leakage light that is not coupled to an optical waveguide between a top surface of the optical waveguide substrate 14 and the clad layer 15. As the result, light leaked downward through the clad layer 15 is reflected upward when it reaches the metal layer 41. Therefore, the light leaked downward through the clad layer 15 can also be received at the light receiving surface 18 of the light monitor 13, and a greater light receiving current can be obtained.

Figure 5A:
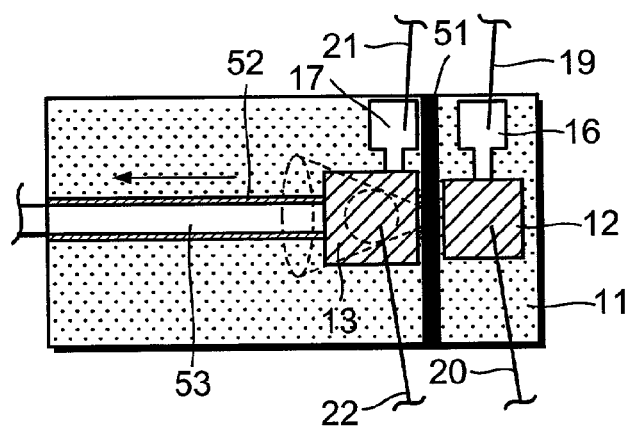
FIG. 5A is a front diagram showing a fourth exemplary embodiment of an optical semiconductor module according to the present invention.
Figure 5B:
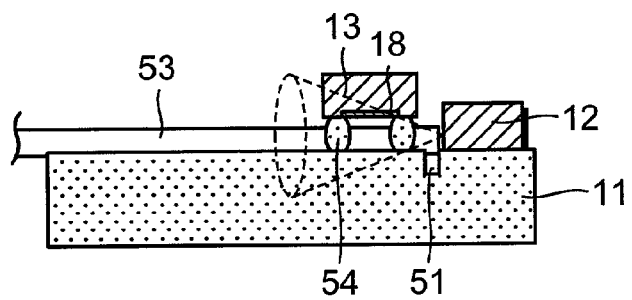
FIG. 5B is a side view of the optical semiconductor module of FIG. 5A.

Referring to FIG. 5A, a fourth exemplary embodiment of the present invention is shown. FIG. 5B is a side view of the optical semiconductor module of FIG. 5A. In FIGS. 5A and 5B, the light monitor 13 is installed not on an optical waveguide but above an optical fiber. As to the same elements shown in FIGS. 2A and 2B, the same reference numbers are used.

On the substrate 11, a groove 52 that positions an optical fiber 53 and a groove 51 that contacts the optical fiber 53 are provided. The groove 52 positions the optical fiber 53 in a direction parallel to an optical axis. The optical fiber 53 bumps against the groove 51, which has a direction perpendicular to the optical axis, without adjusting the optical axis. The light emitting element 12 is coupled to the electrode 16, and light emitted from the light emitting element 12 can be coupled to the optical fiber 53. The light monitor 13 is installed above the optical fiber 53 such that the light receiving surface 18 of the light monitor 13 faces downward so as to receive a portion of leakage light that is not coupled to the optical fiber 53. In order to prevent the light monitor 13 from contacting the optical fiber 53, the light monitor 13 is joined to the electrode 17 provided on the substrate 11 through a solder bump 54. Also, in order to prevent light leaked into a clad of the optical fiber 15 from being reflected at an outer peripheral portion of the optical fiber 15, the entire optical semiconductor module is covered with transparent resin that has a closely matched refractive index.

Figure 6:
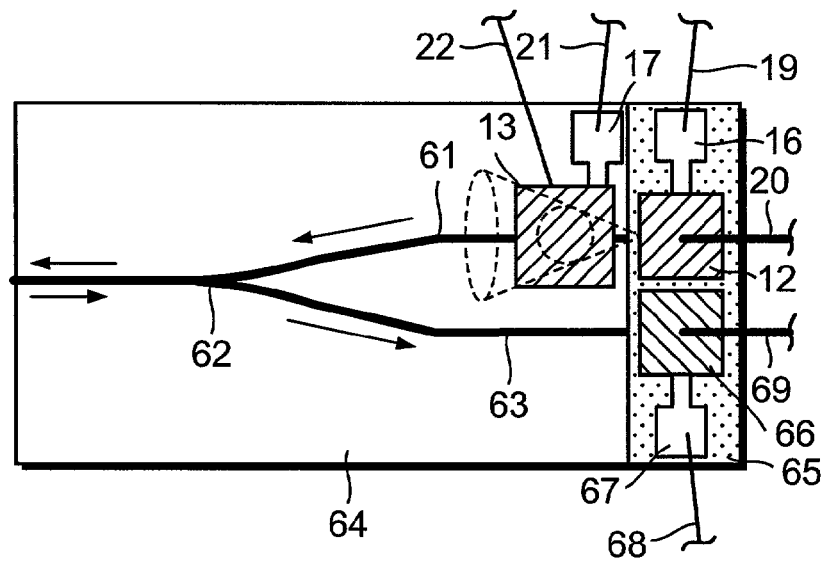
FIG. 6 is a diagram showing a fifth exemplary embodiment of an optical semiconductor module according to the present invention.

Referring to FIG. 6, a fifth exemplary embodiment is shown. The optical semiconductor module has a light transmission-reception function with a Y branch waveguide 62 provided on an optical waveguide substrate 65 and a light receiving element 66 also installed on the optical waveguide substrate 65. For the same elements shown in FIGS. 2A and 2B, the same reference numbers are used.

On the optical waveguide substrate 65, a first optical waveguide 61, a second optical waveguide 63, a Y branch waveguide 62, an electrode 16 coupled to a light emitting element 12, an electrode 17 coupled to a light monitor 13 and an electrode 67 coupled to a light receiving element 66 are provided. A light emitting element 12 is coupled to the electrode 16, and light emitted from the light emitting element 12 can be coupled to the first optical waveguide 61. The light monitor 13 is installed on the electrode 17 formed on the clad layer 15 (as shown in FIG. 2B) such that the light receiving surface 18 (as shown in FIG. 2B) of the light monitor 13 faces downward so as to receive a portion of the leakage light that is not coupled to the first optical waveguide 61. The light receiving element 66 is coupled to the electrode 67, and is also coupled to the second optical waveguide 63. Wires 68 and 69 are connected to the top surfaces of the electrode 67 and the light receiving element 66, respectively, so that current can flow from the light receiving element 66. Also, in order to prevent light leaked to the inside of the clad layer 64 from being reflected at the top surface of the clad layer 64, the entire optical semiconductor module is covered with transparent resin, which is closely matched to the refractive index of the clad layer 64. In this exemplary embodiment, by using the light monitor of the present invention, it is possible to arrange the light monitor on the substrate on which the light emitting element and the light receiving element are arranged.

Figure 7:
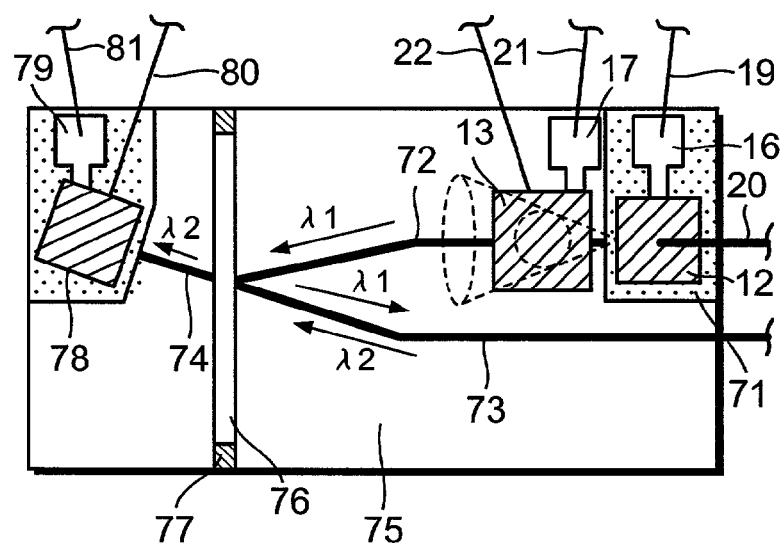
FIG. 7 is a diagram showing a sixth exemplary embodiment of an optical semiconductor module according to the present invention.

Referring to FIG. 7, a sixth exemplary embodiment is shown. The optical semiconductor module has a light transmission-reception function of transmitting light of a wavelength $\lambda 1$ and receiving light of a wavelength $\lambda 2$.

On an optical waveguide substrate 71, there are provided a first optical waveguide 72, a second optical waveguide 73, a third optical waveguide 74, a groove 77 for a filter 76, an electrode 16 coupled to a light emitting element 12, an electrode 17 coupled to a light monitor 13, and an electrode 79 coupled to a light receiving element 78. The light emitting element 12 is coupled to the electrode 16, and light emitted from the light emitting element 12 can be coupled to the first optical waveguide 72. The light monitor 13 is coupled to the electrode 17 provided on a clad layer 75. The light receiving surface 18 (as shown in FIG. 2B) of the light monitor 13 faces downward so as to receive a portion of the leakage light that is not coupled to the first optical waveguide 72.

The light receiving element 78 is coupled to the electrode 79 such that light from the third optical waveguide 74 can be coupled to the light receiving element 78. A filter 76 that reflects the light of the wavelength λ1 and allows transmission of the light of the waveguide λ2 is inserted into the groove 77 so that the light incident from the first optical waveguide 72 is reflected and coupled to the second optical waveguide 73. Transmission signal light of the wavelength λ1 emitted from the light emitting element 12 is guided through the first optical waveguide 72, reflected at the filter 76, and guided into a transmission line from the second optical waveguide 73. Reception signal light of the wavelength λ2 which is incident on the second optical waveguide 73 from the transmission line is coupled to the third optical waveguide 74 by transmitting through the filter 76, and received by the light receiving element 78. The light monitor 13 installed on the clad layer 75 receives a portion of the leakage light that is not coupled to the first optical waveguide 72 and is used for control of optical output of the light emitting element 12.

For example, the installment and fixation of the light receiving element to the substrate can be performed by providing a first electrode on a front surface of the light receiving surface side of the light receiving element, providing a second electrode on a front surface of the substrate, and electrically connecting the first electrode with the second electrode.

As described above, the present invention installs the light monitor on the clad layer of the optical waveguide substrate so that its light receiving surface faces downward. Therefore, the light monitor receives a portion of the above-mentioned leakage light that is not coupled to the optical waveguide. As the result, it is possible to make the installment of the light receiving element easy and to produce the optical semiconductor module at lower cost.

Moreover, it is possible to increase the optical output of the front light and improve its temperature properties by making the reflectance of the back surface of the light emitting element larger without using the back light of the light emitting element as the monitor light.

Obviously, numerous additional modifications and variations of the present invention are possible in light of the above teachings. It is, therefore, to be understood that within the scope of the appended claims, the invention may be practiced otherwise than as specifically described herein.

What is claimed is:

1. An optical semiconductor module comprising:
   light emitting means for emitting signal light;
   optical transmitting means for transmitting said signal light surrounded by a clad layer;
   light monitoring means for receiving forward light through said clad layer directly, which is emitted from said light emitting means, provided on said clad layer;
   support means for supporting said light emitting means and said optical transmitting means, and
   reflecting means disposed between said optical waveguide and said support means for reflecting leakage light of said signal light that is not coupled to said optical waveguide;
   wherein said forward light is a portion of leakage light that is not coupled to said optical transmitting means, and
   wherein said optical transmitting means is an optical waveguide.

2. The optical semiconductor module as claimed in claim 1, wherein said light monitoring means is provided on the opposite side of said clad layer from said support means.

3. The optical semiconductor module as claimed in claim 1, wherein said light monitoring means receives leakage light reflected by said reflecting means.

4. The optical semiconductor module as claimed in claim 1, wherein said optical transmitting means is an optical fiber.

5. The optical semiconductor module as claimed in claim 4, further comprising positioning means for positioning said optical fiber so that said signal light emitted from said light emitting means can be optically coupled to said optical fiber.

6. The optical semiconductor module as claimed in claim 4, wherein said light monitoring means is disposed so that it cannot contact said optical fiber.

7. The optical semiconductor module as claimed in claim 1, wherein a current generated by said light monitoring means is used to control said signal light output from said light emitting means.

8. An optical semiconductor module comprising:
   a light emitting element that emits signal light;
   an optical waveguide that transmits said signal light surrounded by a clad layer;
   a light monitor that receives forward light through said clad layer directly, provided on said clad layer, which is emitted from said light emitting element;
   a substrate for supporting said light monitor and said optical waveguide, and
   a reflection film disposed between said optical waveguide and said substrate for reflecting leakage light of said signal light that is not coupled to said optical waveguide.

9. The optical semiconductor module as claimed in claim 8, wherein said light monitor is provided on the opposite side of said clad layer from said substrate.

10. The optical semiconductor module as claimed in claim 8, wherein said forward light is a portion of leakage light that is not coupled to said optical waveguide.

11. The optical semiconductor module as claimed in claim 8, wherein said light monitor receives leakage light reflected by said reflection film.

12. The optical semiconductor module as claimed in claim 8, wherein a current generated by said light monitor is used to control the signal light output of said light emitting element.

* * * * *